United States Patent [19]

Abe et al.

[11] Patent Number: 4,857,141
[45] Date of Patent: Aug. 15, 1989

[54] METHOD OF FORMING HOLES IN SEMICONDUCTOR INTEGRATED CIRCUIT DEVICE

[75] Inventors: Masahiro Abe, Yokohama; Yasukazu Mase, Tokyo, both of Japan

[73] Assignee: Kabushiki Kaisha Toshiba, Kawasaki, Japan

[21] Appl. No.: 181,108

[22] Filed: Apr. 13, 1988

[30] Foreign Application Priority Data

Apr. 16, 1987 [JP] Japan .................................. 62-91876

[51] Int. Cl.⁴ ...................... B44C 1/22; C03C 15/00; C03C 25/06
[52] U.S. Cl. ................................ 156/644; 156/643; 156/646; 156/651; 156/653; 156/657; 156/659.1; 204/192.37; 437/198; 437/199; 437/203; 437/238
[58] Field of Search ...................... 156/643, 644–646, 156/651–653, 657, 659.1, 662; 427/38, 39; 204/192.32, 192.35, 192.37; 437/180, 187, 194, 198, 199, 203, 228, 238; 357/65, 67

[56] References Cited

U.S. PATENT DOCUMENTS

| | | | |
|---|---|---|---|
| 4,461,672 | 7/1984 | Musser | 156/651 X |
| 4,484,979 | 11/1984 | Stocker | 156/651 X |
| 4,487,652 | 12/1984 | Almgren | 156/651 X |
| 4,495,220 | 1/1985 | Wolf et al. | 156/643 X |
| 4,522,681 | 6/1985 | Gorowitz et al. | 156/644 X |
| 4,560,436 | 12/1985 | Bukhman et al. | 156/668 X |
| 4,645,562 | 2/1987 | Liao et al. | 156/643 |
| 4,705,597 | 11/1987 | Gimpelson et al. | 156/644 X |
| 4,764,249 | 8/1988 | Gobrecht et al. | 156/655 X |

FOREIGN PATENT DOCUMENTS 61-187332 8/1986 Japan.

Primary Examiner—William A. Powell
Attorney, Agent, or Firm—Finnegan, Henderson, Farabow, Garrett & Dunner

[57] ABSTRACT

A recess is formed in the surface area of a layer-insulation film by an isotropic etching process, and a hole is formed in the recess by a first anisotropic etching process. After this, a second anisotropic etching process is effected to taper the hole to remove an edge portion at the opening of the recess, the boundary portion between the recess and the side wall formed by the anisotropic etching process, and the vertical side wall of the hole. A wiring metal layer is formed on part of the layer-insulation film and in the hole.

12 Claims, 5 Drawing Sheets

METHOD OF FORMING HOLES IN SEMICONDUCTOR INTEGRATED CIRCUIT DEVICE

BACKGROUND OF THE INVENTION

1. Field of the Invention

This invention relates to a method of forming contact holes or through holes in a semiconductor integrated circuit device, and more particularly, to improvement of the degree of the step coverage of a wiring metal layer.

2. Description of the Related Art

As is represented by VLSI, for example, recent semiconductor integrated circuit devices have been considerably improved in their function and integration density. As a result of this, the technology of forming fine patterns becomes more important. Further, a multi-layered wiring is required in order to improve the function and the integration density of the semiconductor integrated circuit device. In this case, layer-insulation films are formed between respective wiring layers of the multi-layered wiring. The wiring layers are electrically connected to each other by means of through holes selectively formed in the layer-insulation films.

An isotropic etching method is generally used to form the through holes. Further, in recent years, an anisotropic etching method has also been used. A reactive ion etching (RIE) method is known as one of the anisotropic etching methods. The RIE method has superior characteristics that the amount of etching in a lateral direction is small in the etching process and the amount of etching can be easily controlled. Therefore, the through holes can be formed with a precise and small size by use of the RIE method in comparison with the case of using the isotropic etching method. Therefore, the RIE method is generally used to form through holes and contact holes (which are hereinafter referred to simply as holes) in the semiconductor integrated circuit device with a high integration density.

In the case where the holes are formed by the RIE method, the side walls of the holes make an angle substantially equal to right angles with respect to the semiconductor substrate. Therefore, when a metal wiring layer is formed on the layer-insulation film and in the holes by a sputtering method, the metal wiring layer becomes thin on the side wall section in comparison with other sections by the shadowing effect, and it tends to be cut off at the stepped portion. Further, the metal wiring layer may be cut off by the electromigration which is caused by concentration of an operation current generated during the operation of the semiconductor integrated circuit device.

In order to enhance the step coverage of the metal wiring layer and prevent the cut-off of the metal wiring layer at the stepped portion, the side wall of the hole is tapered. To obtain the tapered hole, a photoresist pattern is etched in a lateral direction or the exposed edge portion thereof is etched by the RIE method. That is, the side wall of the hole is tapered by gradually enlarging the pattern opening by the RIE method. In order to etch the photoresist pattern in a lateral direction, it is necessary to set the etching rates of the layer-insulation film and the photoresist substantially equal each other. By setting the etching rates of the layer-insulation film and the photoresist substantially equal to each other, the edge portion of the photoresist pattern is etched more as it becomes thinner in the etching process. Thus, when the edge portion of the photoresist film is gradually etched in a lateral direction in the etching process, the side wall of the hole can be tapered. In this case, if it is required to form a sharply tapered hole, a thick photoresist film is formed. However, if the photoresist film is formed thick, variation in the size of the hole becomes large, preventing formation of small holes. The above variation in the size of the hole becomes significant when the thickness of the photoresist film is larger than 1 $\mu$m. In the case of using a photoresist film with a thickness of less than 1 $\mu$m, the tapering angle of the side wall of the hole becomes small and it becomes difficult to sufficiently suppress reduction in the thickness of the metal wiring layer on the side wall portion which is caused by the shadowing effect. Further, the photoresist film may become rapidly thin as the etching process advances. As a result the possibility arises that pin-holes may be formed in the thin portion of the photoresist film. With the pinholes formed in the photoresist film, a corresponding portion of the layer-insulation film is etched. In this case, it is impossible to attain sufficient insulation between conductive layers formed on the upper and lower sides of the layer-insulation film.

In order to overcome the defects caused by using the RIE method as described above, a combination of the RIE method and isotropic etching method is used as the hole formation method. In this method, the isotropic etching method is first effected to etch that part of the layer-insulation film in which the hole is to be formed. In this way, a recess is formed in the layer-insulation film by the isotropic etching process. Next, a hole is formed in the layer-insulation film within the recess by the RIE method. The hole has a diameter smaller than the recess and is formed to reach the wiring layer formed under the layer-insulation film. This combination of the hole and recess is used as a through hole. That is, the through hole is formed to have a tapered opening which is provided by the recess formed by the isotropic etching method. Since the side wall of the through hole normal to the semiconductor substrate becomes short, the metal wiring layer formed on the layer-insulation film in a position corresponding to the through hole is prevented from being thin at more portion of the through hole, enhancing the step coverage of the metal wiring layer.

However, the through hole of the structure formed by the RIE method as described above still has a side wall portion which is normal to the semiconductor substrate. Therefore, even though the step coverage of the wiring layer on the stepped portion can be improved to some extent, the step coverage of the wiring layer on the side wall cannot be significantly improved. Thus, a satisfactory step coverage cannot be attained.

Another conventional forming method has been proposed in which the hole formed in the layer-insulation film is filled with polysilicon. In this case, a metal wiring layer is formed on the polysilicon layer and the layer-insulation film. Since the metal wiring layer is formed on the flat portion, the step coverage can be significantly improved. However, in this case, the manufacturing process becomes considerably complicated.

SUMMARY OF THE INVENTION

An object of this invention is to provide a hole forming method capable of improving the step coverage of a metal wiring layer without making the manufacturing process complicated.

The above object can be attained by a hole forming method comprising the steps of forming an insulation layer on a conductive layer; forming a recess in the surface area of the insulation layer on the conductive layer by an isotropic etching method; forming a hole in the recess to reach the conductive layer by a first anisotropic etching process, the hole being narrower in width than the recess; effecting a second anisotropic etching method to taper the recess and hole; and forming a metal wiring layer on part of the insulation layer and in the hole.

With the manufacturing method described above, after the isotropic etching process is effected to form the recess and the first anisotropic etching process is effected to form the hole in the recess, the second anisotropic etching process is effected to smooth the opening edge portion of the recess and the boundary portion (edge portion) between the recess and the hole, and remove the vertical side wall portion of the hole formed by the first anisotropic etching process to provide a hole tapered in its entirety. Thus, the step coverage of the metal wiring layer can be improved. Since, in the tapering process, the photoresist pattern is not subjected to the backward etching, variation in the size of the hole in the etching process can be suppressed to a minimum. Therefore, there is no possibility that pinholes are formed to cause a defective insulation. Further, since the manufacturing method of this invention can be attained by simply adding the second anisotropic etching process to the conventional manufacturing method, in which the hole is filled with polysilicon, the in that the manufacturing process is kept relatively simple.

DETAILED DESCRIPTION OF THE PREFERRED EMBODIMENTS

Figure 1A:
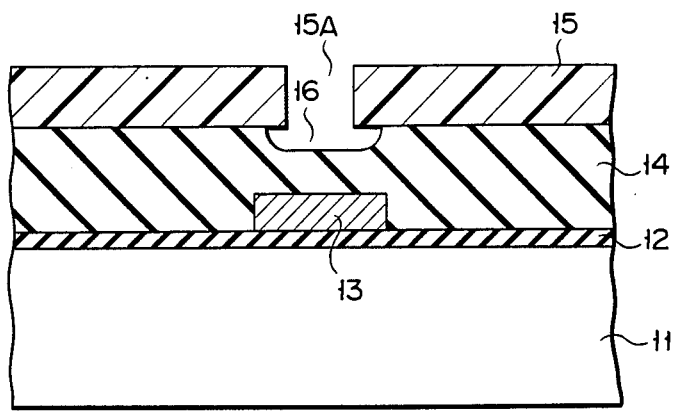
FIGS. 1A to 1E are cross sectional views for explaining a hole forming method according to a first embodiment of this invention.

FIGS. 1A to 1E are cross sectional views for explaining part of a method of forming a semiconductor integrated circuit device according to a first embodiment of this invention. FIGS. 1A to 1E show the manufacturing method of forming a through hole in a layerinsulation film in the semiconductor integrated circuit device. As shown in FIG. 1A, thermal oxide film 12 is formed on semiconductor substrate (silicon substrate) 11. A conductive metal layer of approx. 0.8 μm is formed on thermal oxide film 12 by a sputtering process, for example. The material for the metal layer may be Al, Al-Si, Al-Si-Cu, or the like. The metal layer is patterned to form first wiring layer 13. A CVD-SiO$_2$ film 14 of a thickness of approx. 2.5 μm is formed over the entire surface of the resultant semiconductor structure. CVD-SiO$_2$ film 14 is used as a layer-insulation film. A planarizing resist which is not shown is formed on SiO$_2$ film 14. In order to planarize SiO$_2$ film 14, the planarization resist and SiO$_2$ film 14 are selectively etched by the RIE method. In this etching process, SiO$_2$ film 14 is planarized to have a thickness of 1.5 μm on the metal wiring layer and 2.3 μm on other field portions.

Photoresist film 15 is formed on planarized SiO$_2$ film 14. Hole pattern 15A is formed in a corresponding position on first wiring layer 13 of photoresist film 15. SiO$_2$ film 14 is selectively etched by an isotropic etching method with photoresist film 15 used as a mask. In this etching process, ammonium flouride (NH$_4$F) is used as etchant. A recess with a depth of 0.4 μm is formed on SiO$_2$ film 14 in the etching process. It is preferable that the depth of recess 16 is set to one third of the thickness of SiO$_2$ film 14. The reason for this is as follows: When the depth of recess 16 increases, the diameter of the through hole is enlarged by the side etching, making it difficult to attain the fine semiconductor structure. Further, SiO$_2$ film 14 which is formed by the CVD method is mechanically weak in a portion corresponding to the corner portion of metal wiring layer 13. Therefore, if recess 16 if formed deep, it may reach the weak portion of SiO$_2$ film 14 to form a pinhole in SiO$_2$ film 14. For the reason described above, it is preferable to set the depth of recess 16 to one third the thickness of SiO$_2$ film 14.

Next, the semiconductor structure is subjected to a washing process, and then is dried.

Figure 1B:
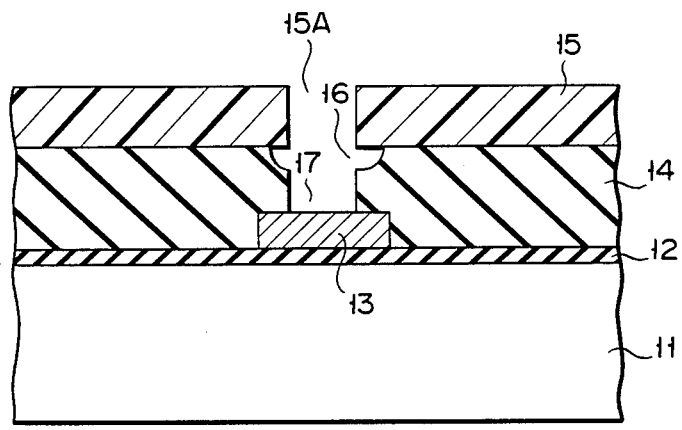

After this, an anisotropic etching process such as an RIE process is effected to form hole 17 shown in FIG. 1B with photoresist film 15 used as a mask. The etching process is effected until hole 17 reaches first wiring layer 13. In the case where a parallel plate electrode type device which is generally used for the RIE process is used, the etching process is effected in the following conditions. That is, the etching process is effected under the condition that the flow rate of CF$_4$ is 20 SCCM, the flow rate of oxygen O$_2$ is 10 SCCM, the pressure is 1.2 Pa and RF power is 350 W.

Figure 1C:
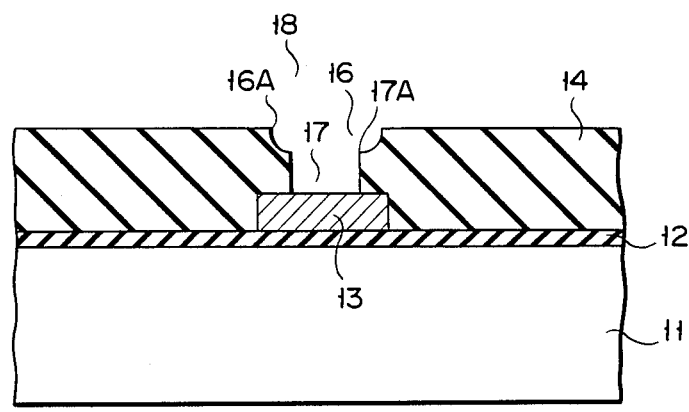

Then, photoresist film 15 is removed by an ashing process to provide a semiconductor structure of FIG. 1C. Through hole 18 has edge portion 16A at the opening thereof and edge portion 17A at the boundary between recess 16 and hole 17.

Figure 1D:
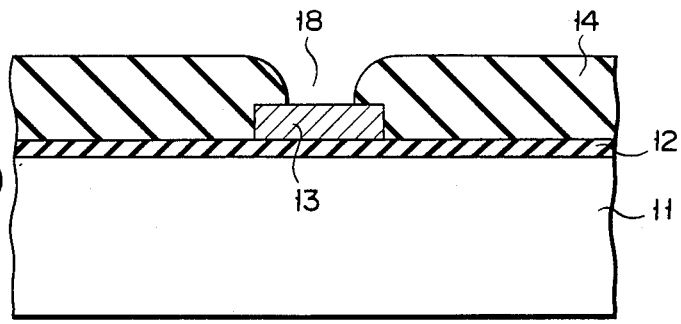

Next, SiO$_2$ film 14 is subjected to a second anisotropic etching process such as an RIE process. The conditions in the RIE process may be set in the same manner as in the first RIE process. In the second RIE process, edge portions 16A and 17A of SiO$_2$ film 14 are removed as shown in FIG. 1D, thus tapering through hole 18 or providing an inclined smooth side wall.

Figure 1E:
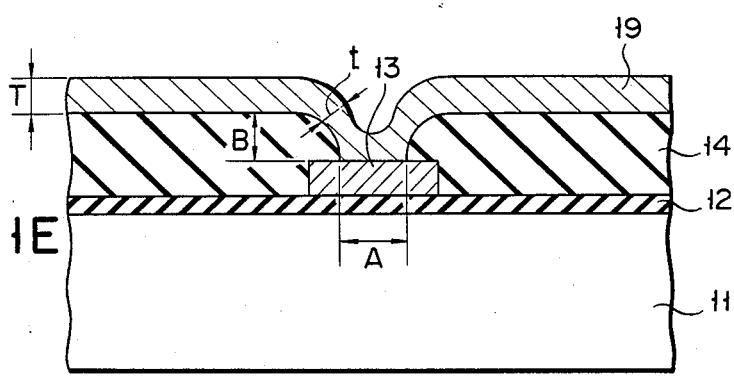

Then, as shown in FIG. 1E, conductive metal layer 19 is formed on SiO$_2$ film 14 and in through hole 18. Conductive metal layer 19 is formed by vapor-depositing conductive material such as Al, Al-Si and Al-Si-Cu by a sputtering method. Since through hole 18 is formed with a large tapering degree, there is little possibility that a metal layer is made thin by the shadowing effect. After this, conductive metal layer 19 is patterned to form a second wiring layer.

With the manufacturing method described above, after the isotropic etching process is effected to form recess 16 and the first anisotropic etching process is effected to form hole 17 in recess 16, then the second anisotropic etching process is effected to smooth opening edge portion 16A of recess 16 and the boundary portion (edge portion 17A) between recess 16 and hole 17, and remove the vertical side wall portion of hole formed in the first anisotropic etching process to provide through hole 18 tapered in its entirety. Thus, the step coverage of metal wiring layer 19 can be improved. Since, in the tapering process, the photoresist pattern is not subjected to the lateral etching, variation in the size of the hole in the etching process can be suppressed to a minimum. Therefore, there is no possibility that pinholes are formed in layer-insulation film 14 to cause a defective insulation. Further, since the manufacturing method of this invention can be attained by simply adding the second anisotropic etching process to the conventional manufacturing method, it is advantageous over the conventional method in which polysilicon is filled in the hole in that the manufacturing process can be kept relatively simple. Further, contaminants diffused from photoresist film 15 and a natural oxide film formed on wiring layer 13 which is the bottom surface of through hole 18 can be effectively removed by the second anisotropic etching process. This improves the property of electrical connection between first and second wiring layers 13 and 19.

Figure 2A:
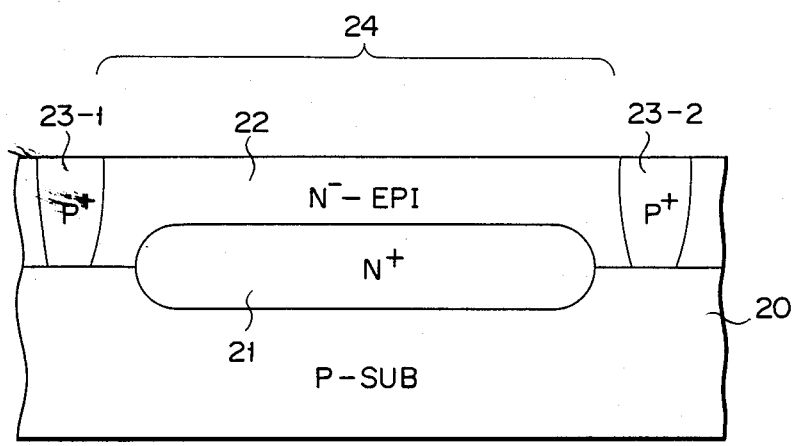
FIGS. 2A to 2H are cross sectional views for explaining a hole forming method according to a second embodiment of this invention.

FIGS. 2A to 2H show a manufacturing process according to a second embodiment of this invention in which the hole forming process shown in FIGS. 1A to 1E is used to form a bipolar transistor. In FIG. 2A, P-type semiconductor substrate (silicon substrate) 20 has impurity such as boron doped therein to have resistivity is of 20 to 50 $\Omega$.cm. N$^+$-type impurity region 21 is formed in a specified area of semiconductor substrate 20 by doping impurity into semiconductor substrate 20 by ion-implantation or diffusion technique. In this case, antimony Sb is used as impurity for forming impurity region 21, for example, and the impurity concentration of Sb is approx. $1 \times 10^{19}$ atoms/cc. Impurity region 21 serves to reduce the collector resistance of the bipolar transistor.

N$^-$-type epitaxial layer 22 having resistivity is of 0.5 to 0.6 $\Omega$.cm and a thickness of 2 $\mu$m is formed on semiconductor substrate 20. Epitaxial layer 22 contains phosphor as impurity. Epitaxial layer 22 is formed to cover impurity region 21, and as a result, impurity region 21 is formed as an embedded layer. In this case, phospor contained in impurity region 21 is diffused into epitaxial layer 22, and embedded layer 21 extends toward epitaxial layer 22 to have a cross section as shown in FIG. 2A.

P$^+$-type element isolation regions 23-1 and 23-2 is formed in epitaxial layer 22 to define element region 24. Element isolation regions 23-1 and 23-2 are integrally formed in an annular form, and a region surrounded by element isolation regions 23-1 and 23-2 is used as element region 24. Element isolation regions 23-1 and 23-2 are formed by solid phase diffusion using a BSG film (not shown) formed on epitaxial layer 22 as an impurity source. Boron of $1 \times 10^{19}$ atoms/cc is diffused from the BSG film into element isolation regions 23-1 and 23-2.

Figure 2B:
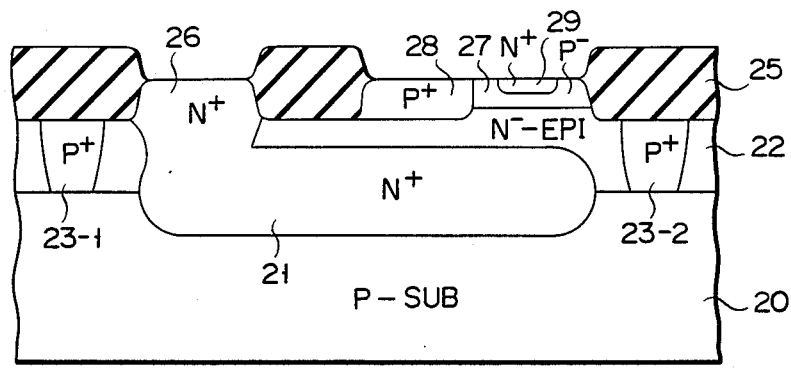

Next, field oxide film 25 is selectively formed on epitaxial layer 22 with the lower part thereof being buried in epitaxial layer 22 as shown in FIG. 2B. Field oxide film 25 is formed by, for example, a LOCOS method. In the process of forming field oxide film 25, a collector extraction region, a base extraction region, a baseformation region and an emitter-formation region are masked by an oxidation resistive film. Deep N$^+$-type layer 26 functioning as the collector extraction region is formed in epitaxial layer 22 to reach embedded layer 21. In the process of forming deep N$^+$-type layer 26, ion-implantation is effected with a photoresist film used as a mask. After the ion-implantation, a heat treatment is effected to diffuse ion-implanted impurity so as to connect deep N$^+$-type layer 26 and embedded layer 21 to each other.

Base region 27 is formed by ion-implantation of boron with a photoresist film used as a mask. The impurity concentration of base region 27 is approx. $1 \times 10^{17}$ atoms/cc. Based extraction region 28 having an impurity concentration of $1 \times 10^{19}$ atoms/cc is formed in contact with base region 27.

Emitter region 29 is formed by doping arsenic As into the surface area of base region 27. The arsenic impurity concentration of emitter region 29 is $1 \times 10^{20}$ atoms/cc.

Figure 2C:
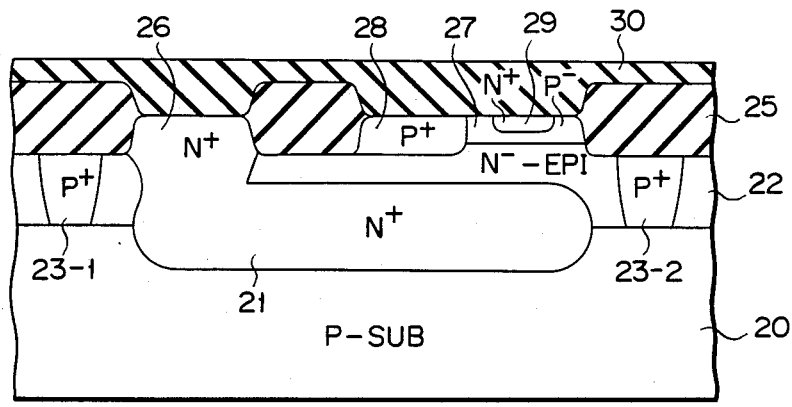

CVD-SiO$_2$ film 30 is formed on the entire surface of the resultant semiconductor structure, and photoresist is coated on CVD-SiO$_2$ film 30 for planarization. Then, an RIE process is effected to planarize SiO$_2$ film 30, thus providing a semiconductor structure as shown in FIG. 2C.

Figure 2D:
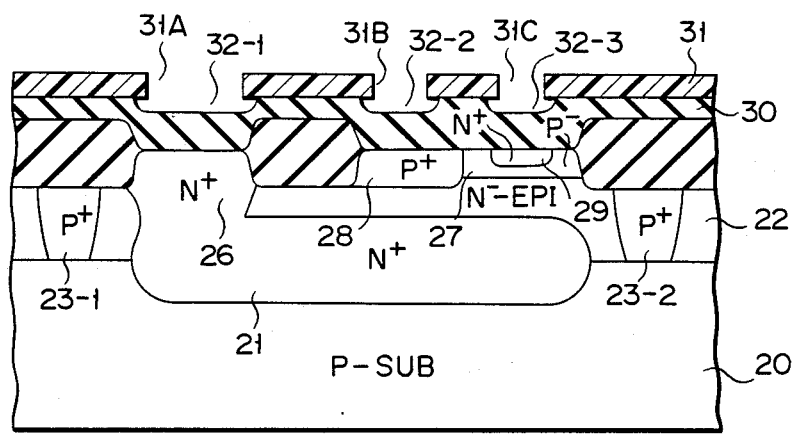

As shown in FIG. 2D, photoresist film 31 is formed on SiO$_2$ film 30, and hole patterns 31A, 31B and 31C are formed in photoresist film 31 in positions corresponding to deep N$^+$-type layer 26, base extraction region 28 and emitter region 29. Then, SiO$_2$ film 30 is subjected to an isotropic etching process with photoresist film 31 used as a mask. In the etching process, ammonium flouride (NH$_4$F) is used as etchant. The etching process is effected to form recesses 32-1, 32-2 and 32-3 with a depth of 0.4 $\mu$m in the surface area of SiO$_2$ film 30. Recesses 32-1, 32-2 and 32-3 are formed in the surface area of CVD-SiO$_2$ -type layer 26 base extraction region 28 and emitter region 29. The depth of recesses 32-1 to 32-3 is set preferably to one third the thickness of SiO$_2$ film 30. After this, the resultant semiconductor structure is washed by using water and dried.

Figure 2E:
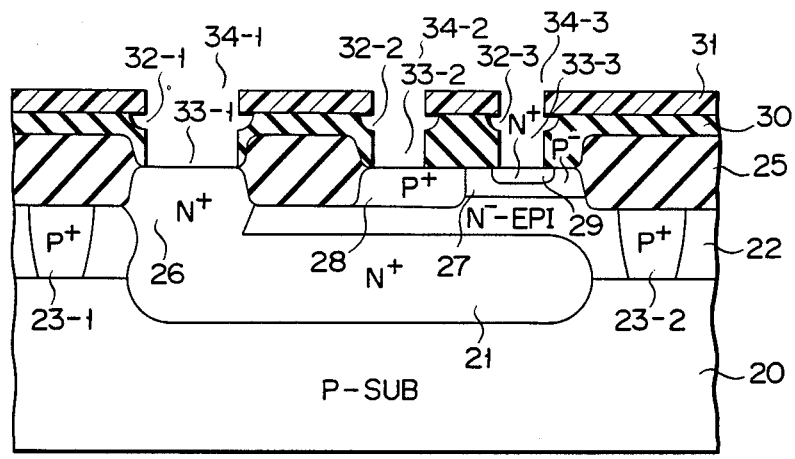

Next, as shown in FIG. 2E, an anisotropic etching process such as an RIE process is effected to form holes which reach the surface of epitaxial layer 22. As the result of the etching process, holes 33-1 to 33-3 having smaller diameter than recesses 32-1 to 32-3 are formed in recesses 32-1 to 32-3. In the case where a parallel plate electrode type device which is generally used for the RIE process is used, the etching process is effected uner the condition that the flow rate of CF$_4$ is 20 SCCM, the flow rate of oxygen O$_2$ is 10 SCCM, the pressure is 1.2 Pa and RF power is 350 W. Contact holes 34-1 to 34-3 thus formed have edge portions in the respective openings and edge portions between the recesses and the holes in the same manner as the hole shown in FIG. 1C. Further, part of the side wall of respective holes 33-1 to 33-3 is formed normal to semiconductor substrate 20.

Figure 2F:
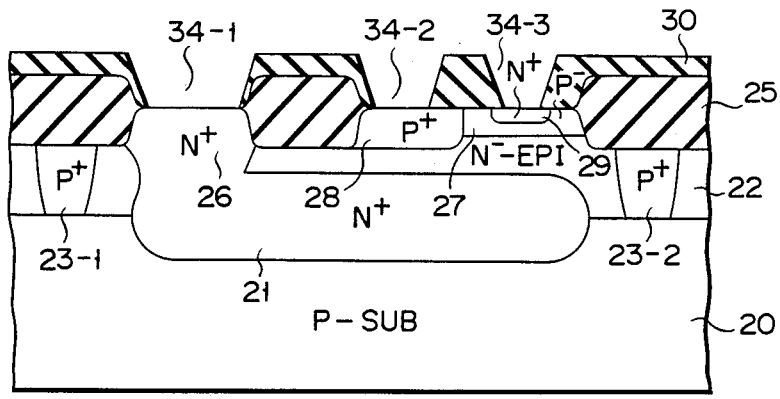

Then, photoresist film 31 is removed by an ashing process. Next, SiO$_2$ film 30 is subjected to a second anisotropic etching process such as an RIE process. The conditions in the RIE process may be set in the same manner as in the first RIE process. After SiO$_2$ film 30 has been subjected to the second RIE process, edge portions of the openings of recesses 32-1 to 32-3, boundary edge portions between recesses 32-1 to 32-3 and holes 33-1 to 33-3 and vertical portions of the side wall of holes 33-1 to 33-3 are removed as shown in FIG. 2F, thus tapering contact holes 34-1 to 34-3 or providing inclined smooth side walls.

Figure 2G:
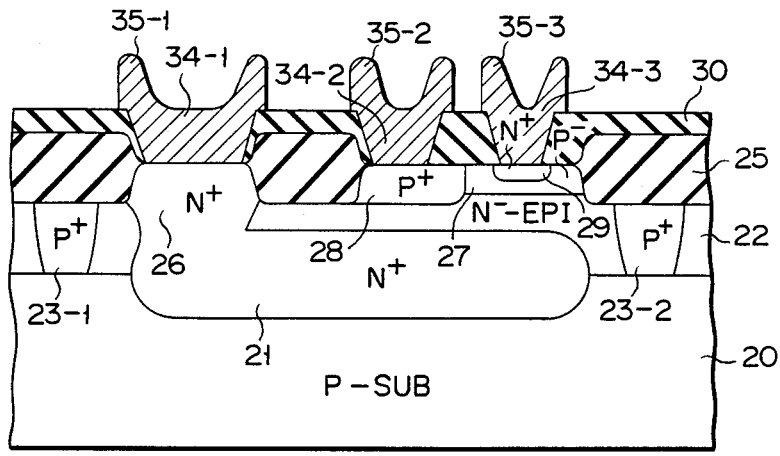

Then, a conductive metal layer is formed on SiO$_2$ film 30 and in contact holes 34-1 to 34-3. The metal layer is formed by vapor-depositing conductive material such as Al, Al-Si or Al-Si-Cu by a sputtering method. The metal layer is patterned to form collector electrode 35-1, based electrode 35-2 and emitter electrode 35-3 as shown in FIG. 2G. Since contact holes 34-1 to 34-3 are formed with a large tapering degree, there is little possibility that a metal layer formed by sputtering is made thin by the shadowing effect.

Figure 2H:
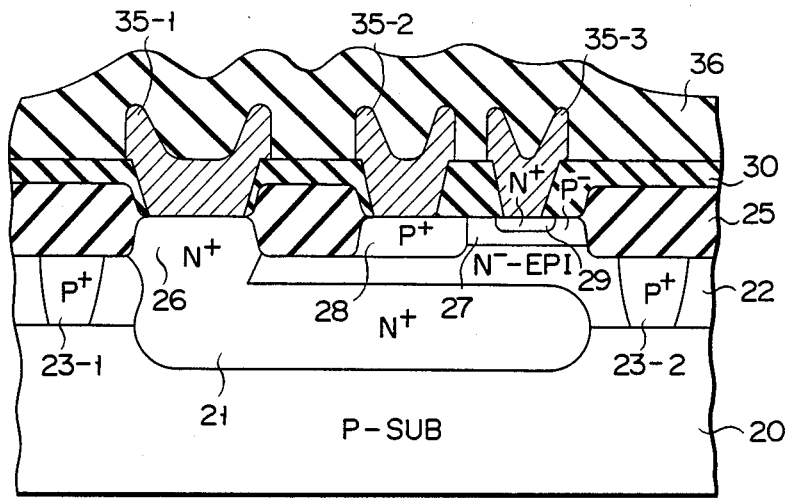

Next, as shown in FIG. 2H, passivation film 36 is formed over the entire surface of the resultant semiconductor structure. In this case, a PSG film or SiN film may be used to form passivation film 36. Thus, a semiconductor device having a transistor integrated therein is obtained.

With the manufacturing method described above, the step coverage of the metal wiring layer can be markedly improved in the case where the diffusion wiring layer formed in the semiconductor substrate is connected to the metal wiring layer via the contract hole, or the diffusion layer constituting part of the semiconductor element is connected to the metal wiring layer via the contact hole. In particular, it is necessary to reduce the distance between the base and emitter regions to a minimum in a bipolar transistor. This is because the capacitance between the base and emitter becomes large to lower the switching speed as the distance between the base and emitter becomes large. For this reason, it is necessary to set the distance between the contact holes respectively formed for the base and emitter regions as short as possible. As described above, in this embodiment, since the side walls of the contact holes are tapered to improve the step coverage of the metal wiring layer, the distance between the contact holes can be reduced to a minimum. Therefore, the capacitance between the base and emitter can be lowered, and the switching speed of the transistor can be enhanced. Further, this invention can be attained by simply adding the second anisotropic process to the conventional manufacturing method, that is, this invention can be attained without making the manufacturing process complicated. In addition, contaminants diffused out from the photoresist and deposited on the surface of the semiconductor substrate forming the bottom of the contact hole or the natural oxide film formed on the substrate surface can be removed in the second anisotropic etching process. Thus, the property of electrical connection between the wiring layer and the diffusion layer formed in the semiconductor substrate can be further improved.

Figure 3:
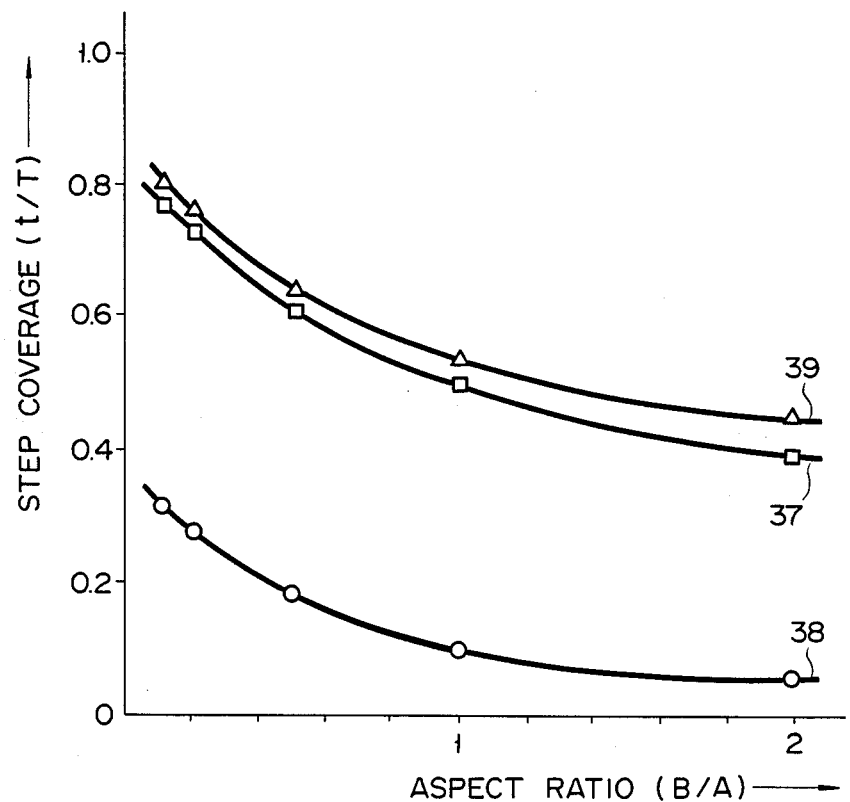
FIG. 3 is a diagram showing the step coverage of the wiring layer and the aspect ratio of a hole in the prior art and this invention.

FIG. 3 shows the relation between the aspect ratio (B/A) of a hole and the step coverage (t/T) of a wiring layer in the cases of the prior art and this invention. Referring to FIG. 1E, A denotes the width of the bottom of the hole (that is, the diameter of the opening of the hole at the upper surface of first metal wiring layer 13), B denotes a depth of the hole (that is, a distance between the upper surface of first metal wiring layer 13 and the upper surface of layer-insulation film 14), T denotes the thickness of that portion of second metal wiring layer 19 which is formed on CVD-SiO$_2$ film 14, and t denotes the thickness of that portion of metal wiring layer 19 which is formed on the side wall of the hole. The aspect ratio is represented by B/A, and the ratio between the thickness t of the thinnest portion of the metal wiring layer which is formed on the side wall of the hole and the thickness T of the metal wiring layer formed on the flat portion is used as an index indicating the degree of the step coverage of the metal wiring layer.

In FIG. 3, the characteristic of the manufacturing method according to this invention is indicated by solid line 37, that of the conventional manufacturing method (which is hereinafter referred to as a first conventional manufacturing method) in which the anisotropic etching process is effected after the isotropic etching process is indicated by solid line 38 and that of the conventional manufacturing method (which is hereinafter referred to as a second conventional manufacturing method) in which a photoresist film is subjected to a lateral etching process to form a tapered hole is indicated by solid line 39. As is clearly seen from FIG. 3, the manufacturing method according to this invention and the second conventional manufacturing method are far superior in the wiring step coverage to the first conventional manufacturing method. In each of the manufacturing methods, the degree of the step coverage is lowered as the aspect ratio increases. From the viewpoint of the step coverage, the second conventional manufacturing method is superior to the manufacturing method of this invention. However, as shown in the following Table 1, the second conventional manufacturing method has disadvantages that size A of the bottom of a contact hole varies and the possibility of pinholes occurring in the layer-insulation film is high.

TABLE 1

|  | This Invention (FIGS. 1A to 1E) | First Conventional Method | Second Conventional Method |
| --- | --- | --- | --- |
| Degree of Step Coverage (Aspect Ratio:1.0) | 0.51 | 0.10 | 0.55 |
| Final Size (Mask Size 2.0 μm) | 2.06 ± 0.05 | 2.05 ± 0.05 | 2.60 ± 0.40 |
| Rate of Occurrence of Pinholes (cm$^{-2}$) | less than 0.01 | less than 0.01 | 0.1 to 7.0 |
| Hole Conduction Probability % (Hole Size 2.0 μm) | 99.99998 | 99.9997 | 99.996 |

In the above Table 1, the hole conduction probability indicates the probability that one hole having a specified form is attained. Variation in the final size is expressed by $2\rho$ ($\rho$ is a standard deviation).

As shown in Table 1, the manufacturing method according to this invention is superior in the degree of the step coverage to the first conventional manufacturing method, and superior to the second conventional manufacturing method from the viewpoint of variation in the final size and possibility of pinholes occurring in the layer-insulation film.

What is claimed is:

1. A hole forming method for semiconductor integrated circuit device comprising the steps of:
    forming an insulation layer on a conductive layer;
    forming a recess in the surface area of said insulation layer on said conductive layer by an isotropic etching process;
    forming a hole in said recess to reach said conductive layer by a first anisotropic etching process, said hole being narrow in width than said recess;
    effecting a second anisotropic etching process to taper said recess and said hole; and
    forming a metal wiring layer on part of said insulation layer and in said hole.

2. A hole forming method according to claim 1, wherein said conductive layer includes at least one diffusion region of a first conductivity type formed in the surface area of the semiconductor substrate of a second conductivity type.

3. A hole forming method according to claim 2, wherein said diffusion region is used as a wiring layer.

4. A hole forming method according to claim 2, wherein said diffusion region is part of constituents of an semiconductor element formed in said semiconductor substrate.

5. A hole forming method according to claim 1, wherein said conductive layer includes a conductive metal layer formed on an insulation film which is formed on said semiconductor substrate.

6. A hole forming method according to claim 4, wherein said conductive metal layer is formed a conductive material selected from a group consisting of Al, Al-Si, and Al-Si-Cu.

7. A hole forming method according to claim 1, wherein said insulation film includes a CVD-SiO$_2$ film.

8. A hole forming method according to claim 1, wherein said isotropic etching process and first anisotropic etching process are effected with the same resist pattern used as a mask.

9. A hole forming method according to claim 1, wherein each of said first and second anisotropic etching processes is an RIE process.

10. A hole forming method according to claim 1, wherein the depth of said recess formed in said insulation layer by the isotropic etching process is set to substantially one third thickness of said insulation layer.

11. A hole forming method according to claim 1, wherein said metal wiring layer is formed by patterning a metal layer which is formed by a sputtering method.

12. A hole forming method according to claim 11, wherein said metal wiring layer is formed of a conductive material selected from a group consisting of Al, Al-Si, and Al-Si-Cu.

* * * * *